(12) United States Patent
Meguro et al.

(10) Patent No.: US 7,407,549 B2
(45) Date of Patent: Aug. 5, 2008

(54) DIAMOND SINGLE CRYSTAL COMPOSITE SUBSTRATE AND METHOD FOR MANUFACTURING THE SAME

(75) Inventors: Kiichi Meguro, Itami (JP); Yoshiyuki Yamamoto, Itami (JP); Takahiro Imai, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 626 days.

(21) Appl. No.: 10/980,152

(22) Filed: Nov. 4, 2004

(65) Prior Publication Data

US 2005/0139150 A1 Jun. 30, 2005

(30) Foreign Application Priority Data

Dec. 26, 2003 (JP) ............... 2003-432607

(51) Int. Cl.
*C30B 29/02* (2006.01)
(52) U.S. Cl. .................... 117/95; 117/96; 117/929; 423/446
(58) Field of Classification Search ........... 423/446; 117/95, 96, 929
See application file for complete search history.

(56) References Cited

U.S. PATENT DOCUMENTS 5,442,199 A * 8/1995 Saito et al. ............... 257/77
5,803,967 A * 9/1998 Plano et al. ............... 117/102
5,804,321 A * 9/1998 Thorpe et al. ............. 428/623

FOREIGN PATENT DOCUMENTS

| JP | 63-182285 | 7/1988 |
| JP | 3-75298 | 3/1991 |
| JP | 6-321690 | 11/1994 |
| JP | 6-321691 | 11/1994 |

OTHER PUBLICATIONS

T. Tsuno, et al. "Growth Rate and Surface Morphology of Diamond Homopitaxial Films on Misoriented (001) Substrates" Jpn. J. Appl. Phys., vol. 35 (1996), Part 1, No. 9A, pp. 4724-4727.
Austrian Search and Examination report, issued in corresponding Austrian Patent Application with Austrian patent application No. 200406149-0 dated Feb. 2, 2007.

\* cited by examiner

*Primary Examiner*—Robert M Kunemund
(74) *Attorney, Agent, or Firm*—McDermott Will & Emery LLP

(57) ABSTRACT

A diamond single crystal composite substrate which are constructed from a plurality of diamond single crystal substrates with uniform plane orientations disposed side by side and integrated overall by growing diamond single crystals thereon by vapor phase synthesis, in which the deviation of the plane orientation of the main plane of each of said plurality of diamond single crystal substrates, excluding one diamond single crystal substrate, from the {100} plane is less than 1 degree, the deviation of the plane orientation of the main plane of the excluded one substrate from the {100} plane is 1 to 8 degrees, said one diamond single crystal substrate is disposed in the outermost circumferential part when the diamond single crystal substrates are disposed side by side, and is disposed so that the <100> direction in the main plane of said one substrate faces in the outer circumferential direction of the disposed substrates, and diamond single crystals are then grown by vapor phase synthesis so that the diamond single crystal grown from said one diamond single substrate is caused to cover the diamond single crystals grown on the other substrates, to achieve an overall integration.

2 Claims, 5 Drawing Sheets

DIAMOND SINGLE CRYSTAL COMPOSITE SUBSTRATE AND METHOD FOR MANUFACTURING THE SAME

BACKGROUND OF THE INVENTION

1. Field of the Invention

The present invention relates to a diamond single crystal composite substrate and a method for manufacturing the same, and more particularly relates to a high-quality diamond single crystal composite substrate with a large area that can be used in semiconductor materials, electronic parts, optical parts and the like, and a method for manufacturing the same.

2. Description of the Prior Art

As a semiconductor material, diamond has numerous superior characteristics not found in other materials, such as a high thermal conductivity, a high electron/positive hole mobility, a high dielectric breakdown field, a low dielectric loss, a broad band gap and the like. Especially in recent years, ultraviolet light-emitting devices utilizing this broad band gap, field effect transistors with superior high-frequency characteristics and the like have been developed.

As in the case of other semiconductor materials, a high-quality single crystal substrate is needed in order to utilize diamond as a semiconductor. Currently, diamond single crystals that are obtained industrially mainly by high-temperature high-pressure synthesis methods are superior in terms of crystallinity even compared to naturally produced single crystals, and can be utilized as semiconductor substrates from the standpoint of physical properties; however, the size of the single crystals obtained is limited to around 1 cm. In the case of such small substrates, semiconductor wafer processes utilizing steppers, electron beam exposure or the like generally use in the micro-fabrication or the like of Si or the like become a problem. In the case of small substrates, it is difficult to use such working devices that were designed for use with wafers having a diameter of several inches, and even if working devices especially meant for use with small substrates are introduced, the difficulty of peripheral processes such as the photo-resist coating process and the like is not resolved.

Accordingly, for example, a method for obtaining large integrated single crystals by disposing a plurality of high pressure phase substances that have substantially the same crystal orientations, thus forming substrates that act as nuclei for vapor phase growth, and then growing a single crystal on top of these nuclei, has been proposed as a method for obtaining diamond single crystal substrates that have a large area (see Japanese Patent Publication No. 3-75298 A).

When the method for obtaining large single crystals according to Japanese Patent Publication No. 3-75298 A is used, the single crystal substrates comprising a plurality of substrates that are used as nuclei for vapor phase growth ordinarily do not have growth plane orientations that are completely identical, but instead have plane orientations that are slightly different from each other. When a single crystal is integrated by performing single crystal vapor phase growth from here, the connecting parts have growth boundaries with different angles, i. e., defects in the broad sense, that are called small angle boundaries, and these grain boundaries do not substantially disappear even if crystal growth is continued. Accordingly, the semiconductor physical properties of region straddling such small angle boundaries are inferior to those of a complete single crystal, and if a device or the like is manufactured on top of the integrated single crystal, the performance is lost in the areas that straddle the small angle boundaries.

SUMMARY OF THE INVENTION

The present invention was made in order to overcome the abovementioned problems; it is an object of the present invention to provide a large-area, high-quality diamond single crystal composite substrate that is used in semiconductor materials, electronic parts, optical parts and the like, and a method for manufacturing the same.

In order to solve the abovementioned problems, the present invention has the following two aspects:

(1) A diamond single crystal composite substrate which is constructed from a plurality of diamond single crystal substrates with uniform plane orientations disposed side by side and integrated overall by growing diamond single crystals thereon by vapor phase synthesis, in which the deviation of the plane orientation of the main plane of each of said plurality of diamond single crystal substrates, excluding one diamond single crystal substrate, from the {100} plane is less than 1 degree, the deviation of the plane orientation of the main plane of the excluded one substrate from the {100} plane is 1 to 8 degrees, said one diamond single crystal substrate is disposed in the outermost circumferential part when the diamond single crystal substrates are disposed side by side, and is disposed so that the <100> direction in the main plane of said one substrate faces in the outer circumferential direction of the disposed substrates, and diamond single crystals are then grown by vapor phase synthesis so that the diamond single crystal grown from said one diamond single substrate is caused to cover single crystals grown on the other substrates, to achieve an overall integration.

(2) A method for manufacturing a diamond single crystal composite substrate which is constructed from a plurality of diamond single crystal substrates with uniform plane orientations disposed side by side and integrated overall by growing diamond single crystals thereon by vapor phase synthesis, the method comprising: providing a plurality of diamond single crystal substrates in which the deviation of the plane orientation of the main plane of each of said plurality of diamond single crystal substrates, excluding one diamond single crystal substrate, from the {100} plane is less than 1 degree and the deviation of the plane orientation of the main plane of the excluded one substrate from the {100} plane is 1 to 8 degrees; disposing said plurality of diamond single crystal substrates side by side in such an arrangement that said one substrate is disposed in the outermost circumferential part and the <100> direction in the main plane of said one substrate faces in the outer circumferential direction of the disposed substrates; and growing diamond single crystals by vapor phase synthesis so that the diamond single crystal grown from said one substrate is caused to cover diamond single crystals grown on the other substrates, to achieve an overall integration.

In the specification, the term "composite substrate" is used to mean a body constructed from a plurality of substrates unless otherwise specified.

DETAILED DESCRIPTION OF THE PREFERRED EMBODIMENTS

Figure 1:
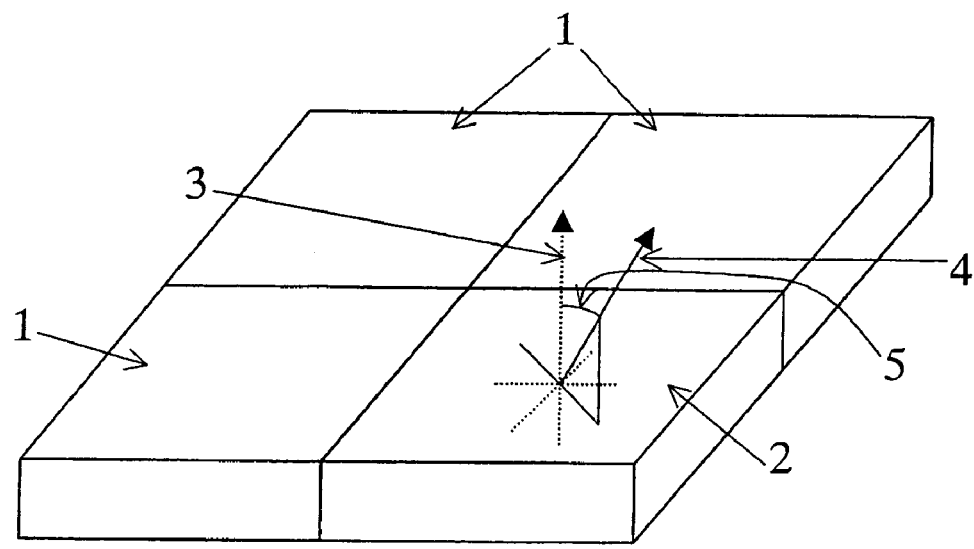
FIG. 1 is a schematic diagram of the disposition of the diamond single crystal substrates used in the present invention.

The present invention will be described below.

In single crystal growth from diamond single crystal substrates by a vapor phase synthesis method, it is known that a difference in growth rate is generated between the substrate plane orientation of a certain single crystal substrate and a plane orientation that is slightly deviated from this first plane orientation (the deviation angle from the reference plane orientation is hereafter referred to as the "off-angle") (e. g., see Jpn. J. Appl. Phys. Vol. 35 (1996) pp. 4724-4727). As is also indicated in this document, this phenomenon is conspicuous when the substrate plane orientation is {100}. The present inventors thought that it might be possible to obtain a substantially large-sized single crystal substrate with no small angle boundaries by utilizing this phenomenon in a single crystal substrate formed by integrating and growing a single crystal substrate by vapor phase synthesis from a plurality of single crystal substrates, and a method for manufacturing the same. Accordingly, the present inventors conducted diligent research based on this approach.

This research led to the perfection of the present invention. Specifically, the off-angle of the plane orientation of the main plane of each of a plurality of substrates (hereafter referred to as the "main substrate"), excluding one diamond single crystal substrate, from the {100} plane is set at less than 1 degree, and the off-angle of the plane orientation of the main plane of the excluded one remaining substrate (hereafter referred to as the "off-substrate") from the {100} plane is set at 1 to 8 degrees. Furthermore, this off-substrate is disposed in the outermost circumferential part when the diamond single crystal substrates are disposed side by side, and is disposed so that the <100> direction in the main plane of this off-substrate faces in the outer circumferential direction of the disposed substrates. When diamond single crystals were then grown by vapor phase synthesis in this state, the following phenomenon was confirmed: namely, the growth rate in the lateral direction onto the main substrates from the off-substrate was greater than the growth rate in the main direction as a novel effect of the present invention. Consequently, the single crystal that was grown from the off-substrate covered the main substrates in a relatively short time of time, thus achieving overall integration. This phenomenon of an increase in the rate of lateral growth was more conspicuous in cases where growth was performed alongside the main substrates than in cases where lateral growth was performed from the off-substrate alone, so that the effect of the present invention in increasing the size of the single crystal substrate was especially evident.

It is sufficient if the this off-angle of the main substrate is less than 1 degree; however, this angle is preferably 0.5 degrees or less, and is ideally close to zero degrees. Furthermore, it is sufficient if the off-angle of the off-substrate is 1 to 8 degrees; however, an angle of 4 to 5 degrees is ideal.

Furthermore, in regard to the shape of the main substrate and off-substrate, it is desirable that these substrates be single crystal substrates with a cubic or rectangular parallelepiped shape, and that the plane orientation of the side surfaces be {100}.

Furthermore, in regard to the disposition of the main substrate and off-substrate, it is desirable that these substrates be disposed in a square or rectangular configuration, i. e., that these substrates be disposed so that the interfaces between the substrates have a cruciform shape, and that these substrates be disposed so that the off-substrate is disposed in the position of an outermost peripheral corner.

Furthermore, in regard to the <100> direction in the main plane of the off-substrate, a direction that faces in the outer circumferential corner edge or angle of the off-substrate is more efficient for integration and growth than a direction facing the outer circumferential side of the off-substrate.

The diamond single crystal composite substrate of the present invention is an integrated single crystal in which no small angle boundaries are present on the outermost surface. In addition, this composite substrate can also be used as a semiconductor substrate by manufacturing devices; however, this composite substrate can be utilized as a diamond single crystal substrate possessing a large surface area and the intrinsic semiconductor characteristics of diamond by cutting out only the integrated layer of the outermost surface.

A large-area, high-quality diamond single crystal substrate can be obtained by using the diamond single crystal composite substrate of the present invention and the abovementioned method for manufacturing the same. This composite substrate can be utilized in semiconductor materials, electronic parts, optical parts and the like.

The present invention will be described in detail below in terms of examples.

EXAMPLE 1

In the present embodiment, four diamond single crystal substrates obtained by high-temperature high-pressure synthesis were prepared. The substrates were three-dimensional bodies with a size of 5 mm (longitudinal and lateral) and a thickness of 0.5 mm, and were polished on the main surfaces and side surfaces. The plane orientations serving as references for the main surfaces and side surfaces were all {100}, and the off-angles of the main surfaces of the three substrates serving as main substrates 1 were 0.1 degrees, 0.4 degrees and 0.9 degrees, respectively. The off-angle 5 of the main surface of the one substrate serving as an off-substrate 2 was 4.5 degrees. Furthermore, as is shown in FIG. 1, the <100> direction 4 of the main surface of the off-substrate 2 faced in the direction of the outer circumferential angle (upward in the <111> direction). Reference numeral 3 is the axis perpendicular to the main surface of the diamond single crystal substrate.

These substrates were disposed "as is" in a substrate holder in the disposition shown in FIG. 1. Then, single crystals were grown by vapor phase growth on these substrates using a universally known microwave plasma CVD method. The growth conditions are shown below.

Figure 2:
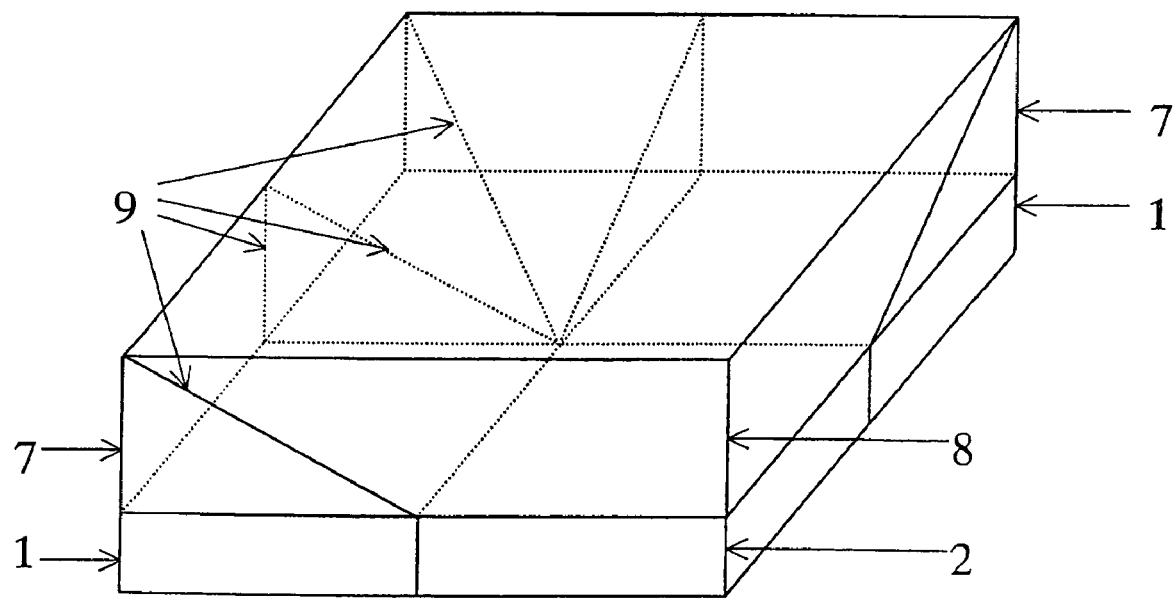
FIG. 2 is a schematic diagram of the diamond single crystal substrates used in the present invention.

Microwave frequency: 2.45 GHz
Microwave power: 5 kW
Chamber internal pressure: $1.33 \times 10^4$ Pa H₂ gas flow rate: 100 sccm
CH₄ gas flow rate: 5 sccm
Substrate temperature: 900° C.
Growth time: 300 hours As a result of film formation, as is shown in FIG. 2, a diamond single crystal composite substrate, square of 10 mm×10 mm, was obtained in which the thickness of the vapor phase synthesized single crystal layer was 3 mm, and in which a single crystal layer 8 grown from the off-substrate covered the entire surface and was integrally connected. Reference numeral 7 represents a single crystal layer grown from the main substrates.

The integrated single crystal layer on the single crystal composite substrate was cut out by laser cutting, and the positive hole mobility of the hydrogenated surface transmission layer at ordinary temperatures was evaluated by Hall measurement; as a result, a high speed value of 1000 cm²/V·sec was obtained.

Next, the results obtained in cases where single crystals were grown in the same growth conditions as in Example 1 for samples in which the off-angles of the main substrates were varied (samples in which a plurality of off-substrates were present), samples in which the off-angle of the off-substrate was varied, samples in which the disposition of the off-substrate was varied, and samples in which the orientation of the off-substrate was varied, will be described as comparative examples. Among these comparative examples, comparative examples in which the disposition of the off-substrate was varied were subjected to growth from 9 single crystal substrates of the same size as the size used in Example 1. In the other comparative examples, the size and number of the substrates were the same as in Example 1. These substrate conditions and disposition conditions are summarized in Table 1.

diagram of the state following growth. Subsequently, the vapor phase synthesized single crystal layer was cut out by laser cutting, and the positive hole mobility in the direction straddling the small angle boundaries at ordinary temperatures was evaluated by Hall measurement. As a result, a low speed (compared to Example 1) of 150 cm²/V·sec was obtained.

Figure 7:
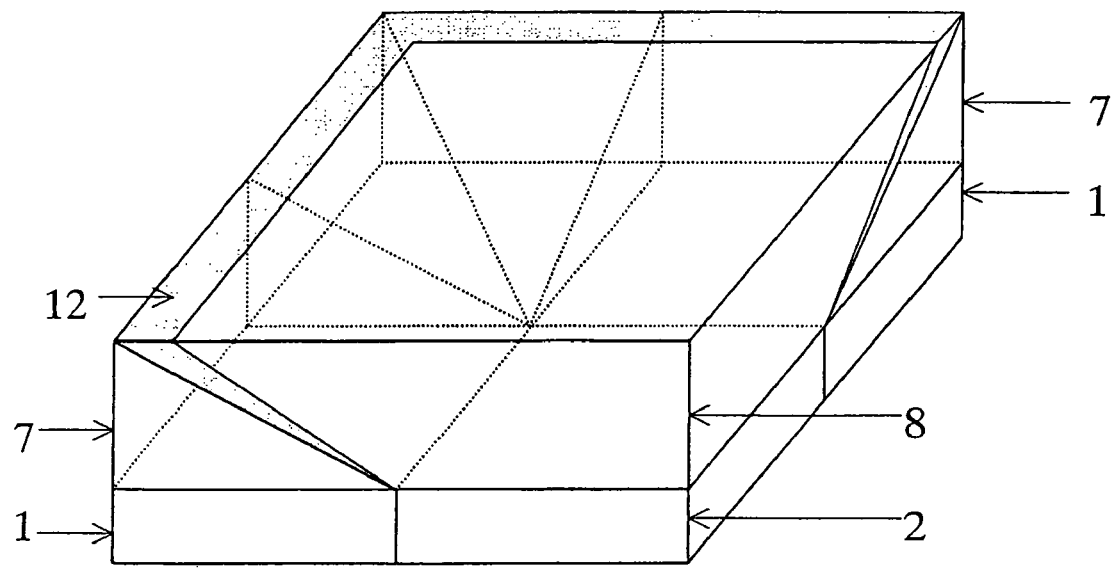
FIG. 7 is a model diagram of the state following single crystal growth in Comparative Example 2.

Next, Comparative Example 2 is an example in which the off-angle of the off-substrate departs from the range of the present invention. As result of a diamond single crystal being grown under the same growth conditions as in the above-mentioned Example 1, a diamond single crystal was grown onto the main substrates 1 from the off-substrate 2; however, a polycrystalline layer 12 developed from the peripheral regions prior to covering the entire surface (FIG. 7). As a result, a single crystal integrated over the entire surface was not obtained.

Figure 4:
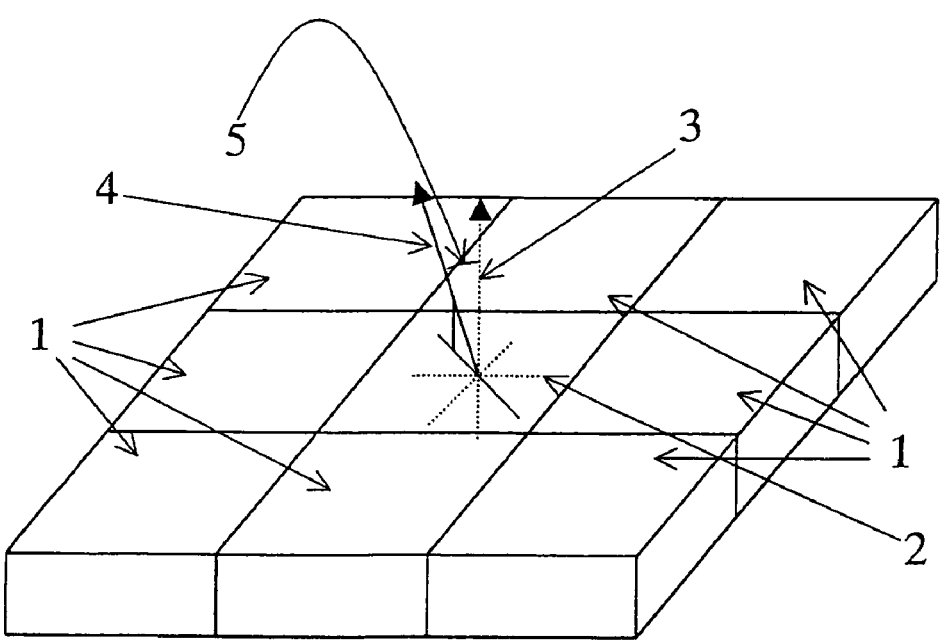
FIG. 4 is a schematic diagram of the substrate disposition in Comparative Example 3, in which an off-substrate is mounted in the center.
Figure 8:
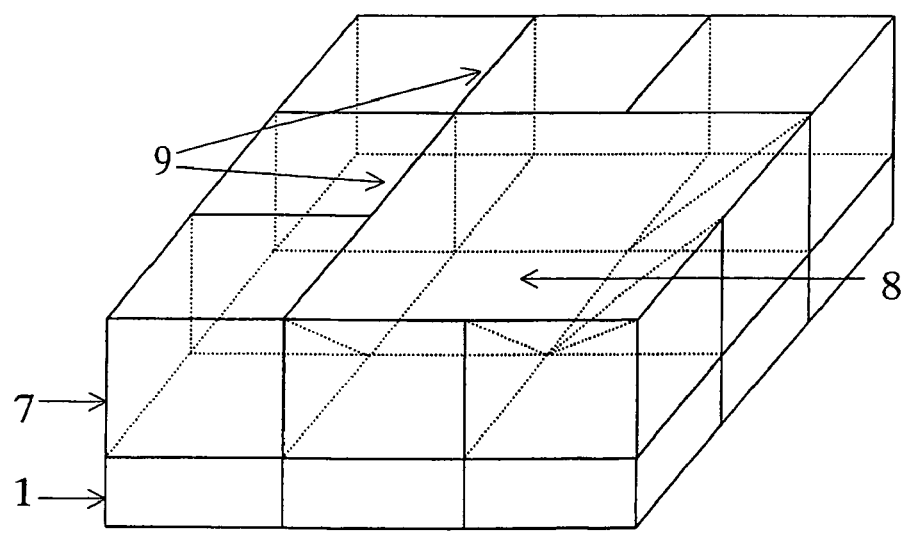
FIG. 8 is a model diagram of the state following single crystal growth in Comparative Example 3.

Next, Comparative Example 3 is an example in which the off-substrate 2 is disposed in the center so as to be surrounded by the main substrates 1 as shown in FIG. 4. As result of a diamond single crystal being grown under the same growth conditions as in the above-mentioned Example 1, a single crystal was grown so that this single crystal covered the three main substrates present in an opposite orientation from the <100> direction 4 of the off-substrate; however, there was no expanded growth onto the other five main substrates, so that single crystals grown from the respective substrates were respectively present. As a result, small angle boundaries 9 remained "as is" on the outermost surface (FIG. 8).

Figure 5:
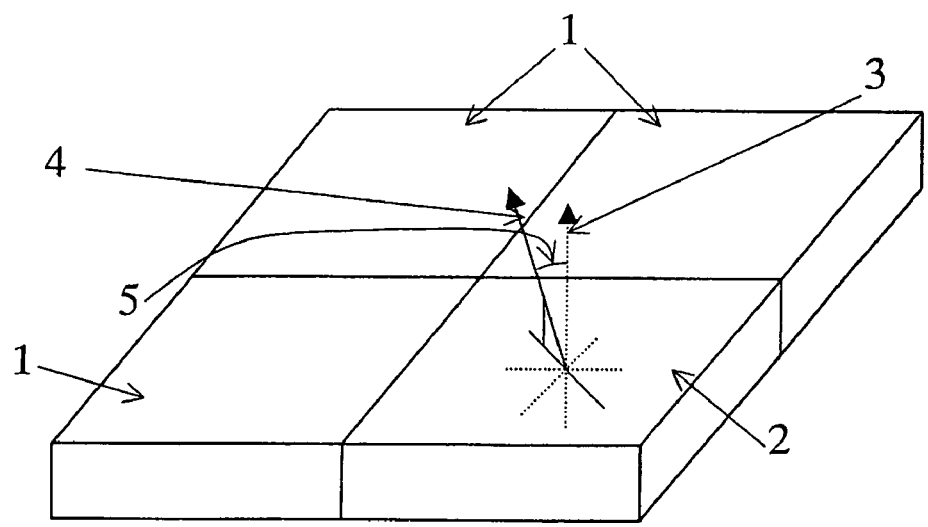
FIG. 5 is a schematic diagram of the substrate disposition in Comparative Example 4, in which the <100> direction of the off-substrate faces the center of the disposed substrates.

Next, Comparative Example 4 is an example in which the <100> direction of the off-substrate 2 faces the center of the disposed substrates as shown in FIG. 5. As result of a diamond single crystal being grown under the same growth conditions

TABLE 1

Figure 3:
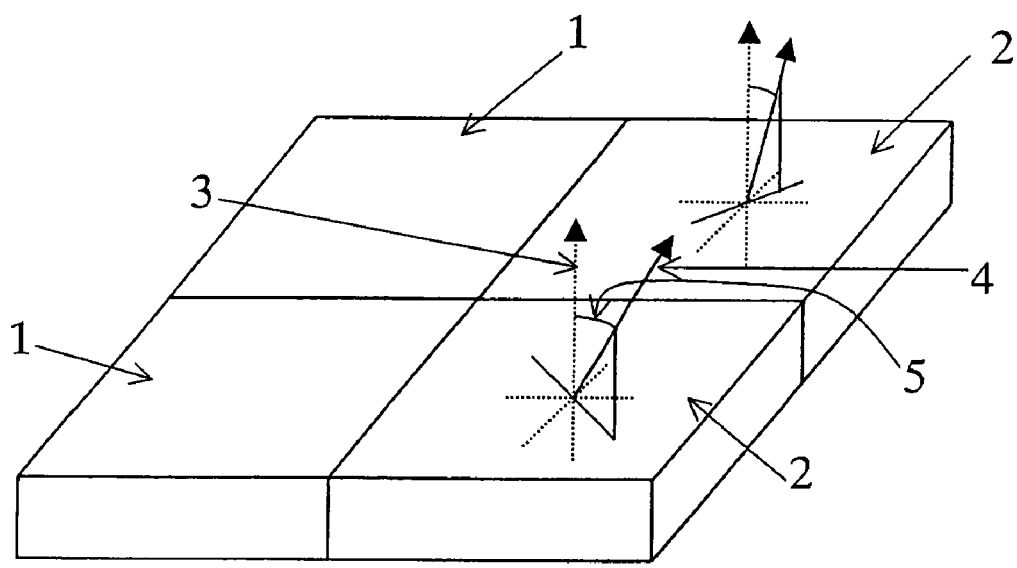
FIG. 3 is a schematic diagram of the substrate disposition in Comparative Example 1, in which a plurality of off-substrates are disposed.

| | Main substrate off-angle (degrees) | Off-substrate off-angle (degrees) | Substrate disposition | | Disposition diagram |
| --- | --- | --- | --- | --- | --- |
| | | | Off-substrate position | Off-substrate <100> direction | |
| Example 1 | 0.1, 0.4, 0.9 | 4.5 | Outer circumference | Outer circumference | FIG. 1 |
| Comparative Example 1 | 0.4, 0.5 | 2.2, 4.1 | Outer circumference | Outer circumference | FIG. 3 |
| Comparative Example 2 | 0.2, 0.4 0.8 | 8.4 | Outer circumference | Outer circumference | FIG. 1 |
| Comparative Example 3 | 0.1, 0.1, 0.2, 0.3, 0.4, 0.4, 0.5, 0.8 | 2.9 | Center | (Outer circumference) | FIG. 4 |
| Comparative Example 4 | 0.3, 0.5, 0.6 | 3.8 | Outer circumference | Center | FIG. 5 |

Figure 6:
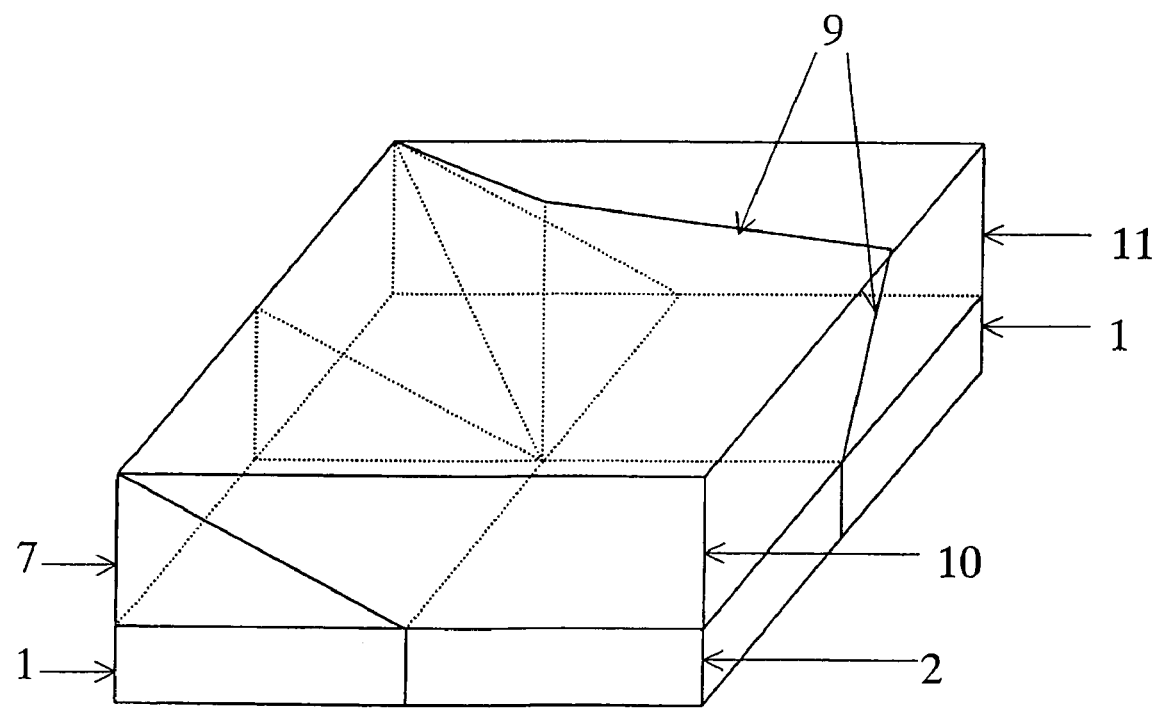
FIG. 6 is a model diagram of the state following single crystal growth in Comparative Example 1.
Figure 9:
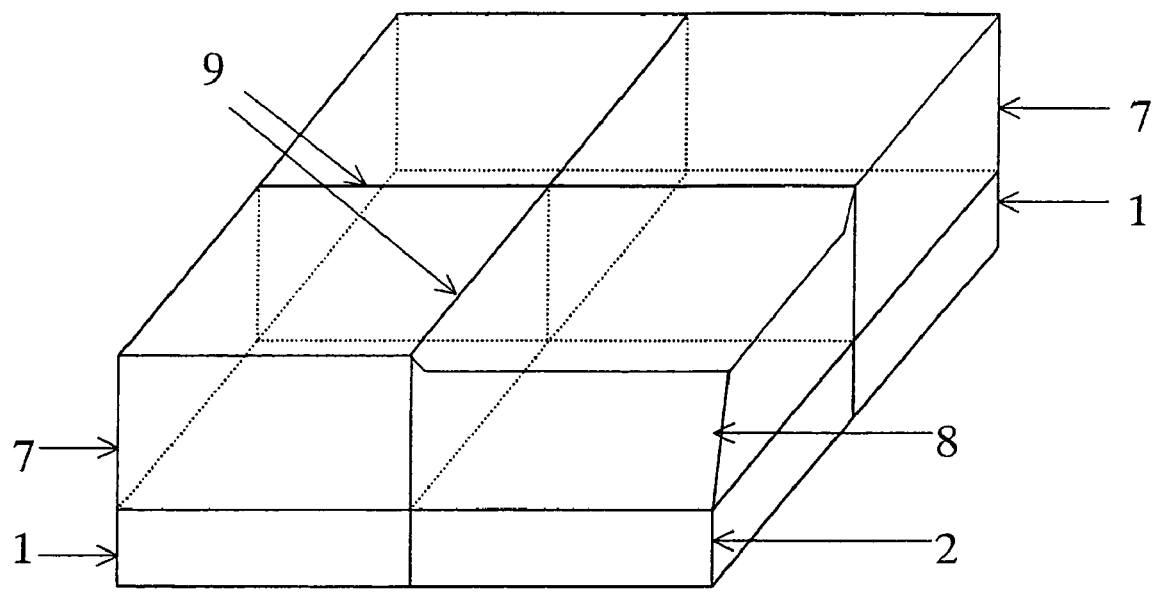
FIG. 9 is a model diagram of the state following single crystal growth in Comparative Example 4.

Among the main substrates, as is shown in FIG. 3, Comparative Example 1 is an example in which one off-angle departs from the conditions for the main substrate 1 in the present invention, but in which the conditions for the off-substrate 2 are satisfied, i. e., a plurality of off-substrates 2 are provided. As a result of diamond single crystal growth under the same growth conditions as in Example 1, single crystals were grown onto the respective main substrates 1 in the lateral direction from the two off-substrates 2; however, since grown single crystal layers 10 and 11 grown from the respective off-substrates interfered with each other, there was no full surface integration, and small angle boundaries 9 originating in the two substrates were present. FIG. 6 shows a model as in the above-mentioned Example 1, a single crystal grown in the lateral direction from the off-substrate faced in the direction of the outer circumference of the substrates; however, there was no expanded growth onto the other substrates. As a result, small angle grain boundaries 9 originating in the four substrates were present on the outermost surface (FIG. 9). Subsequently, the vapor phase synthesized single crystal layer was cut out by laser cutting, and the positive hole mobility in the direction straddling the small angle boundaries 9 at ordinary temperatures was evaluated by Hall measurement. As a result, a low speed (compared to Example 1) of 100 cm²/V·sec was obtained.

Figure 10:
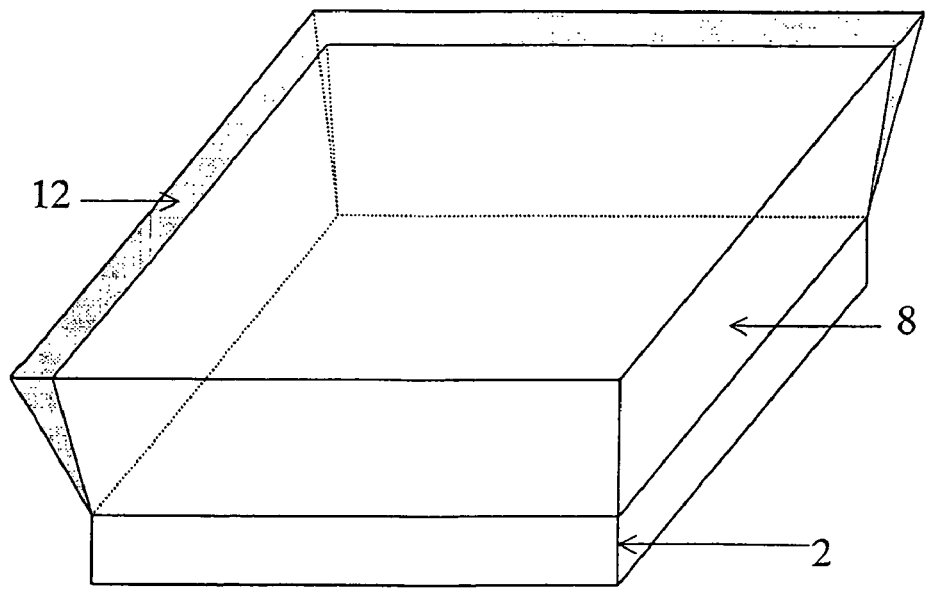
FIG. 10 is a model diagram of the state following single crystal growth in Comparative Example 5.

Furthermore, an example in which a diamond single crystal was grown in a vapor phase from the off-substrate used in Example 1 without using another main substrate will be described as Comparative Example 5. As result of a diamond single crystal being grown under the same growth conditions as in the above-mentioned Example 1 on a single crystal substrate with an off-angle of 4.5 degrees, a diamond single crystal was grown in the lateral direction; however, the growth temperature and the like could not be maintained in the lateral growth region, so that a polycrystalline substance was grown in the outer circumferential portion of the lateral growth region (FIG. 10). Furthermore, in regard to the single crystal size as well, the thickness was the same 3 mm as in Example 1; however, the single crystal growth area stopped at an expansion to a square of 6 mm×6 mm.

EXAMPLE 2

Next, an example in which the off-angle of the off-substrate was varied will be described. The various conditions other than the off-angle of the off-substrate were the same as in the abovementioned Example 1. Here, the off-angles of the off-substrates used were four different angles, i. e., 1.1 degrees, 3.9 degrees, 5.1 degrees and 7.9 degrees. First, in the case of the sample with an off-angle of 1.1 degrees, the single crystal grown from the off-substrate did not cover the single crystal grown from the main substrates in the same growth time of 300 hours as in the above-mentioned Example 1. However, coverage was achieved as shown in FIG. 2 in the case of subsequent additional growth for 200 hours. The thickness of the vapor phase synthesized single crystal layer in this case was 4 mm. When similar growth was performed on the samples having off-angles of 3.9 degrees and 5.1 degrees, complete coverage was not achieved for the growth time of 300 hours; however, coverage was achieved as shown in FIG. 2 by conducting an additional growth for 45 hours and 55 hours, respectively. The respective thicknesses of the vapor phase synthesized single crystal layers in these cases were 3.3 mm and 3.4 mm. For these three embodiments, the integrated single crystal layer was cut out by laser cutting, and the positive hole mobility was evaluated by Hall measurement. As a result, a high value of 1000 $cm^2/V \cdot sec$ was obtained in each case.

Finally, when similar growth was performed for the sample having an off-angle of 7.9 degrees, complete coverage was not obtained in a growth time of 300 hours; however, a single crystal layer grown from the off-substrate covered the entire surface as shown in FIG. 2 in the case of subsequent additional growth for 200 hours. The thickness of the single crystal layer was 4 mm. Subsequently, the integrated single crystal layer was cut out by laser cutting, and the positive hole mobility was evaluated by Hall measurement. As a result, the value obtained, i. e., 900 $cm^2/V \cdot sec$, was slightly lower than that of the abovementioned Example 1; however, this value was sufficiently high for use as a high-performance semiconductor.

Thus, it was indicated that diamond single crystals manufactured by the method represented by the above examples of the present invention are large-area, high-quality single crystal substrates that can be utilized as semiconductor substrates or the like.

What is claimed is:

1. A diamond single crystal composite substrate which is constructed from a plurality of diamond single crystal substrates with uniform plane orientations disposed side by side and integrated overall by growing diamond single crystals thereon by vapor phase synthesis, in which the deviation of the plane orientation of the main plane of each of said plurality of diamond single crystal substrates, excluding one diamond single crystal substrate, from the {100} plane is less than 1 degree, the deviation of the plane orientation of the main plane of the excluded one substrate from the {100} plane is 1 to 8 degrees, said one diamond single crystal substrate is disposed in the outermost circumferential part when the diamond single crystal substrates are disposed side by side, and is disposed so that the <100> direction in the main plane of said one substrate faces in the outer circumferential direction of the disposed substrates, and diamond single crystals are then grown by vapor phase synthesis so that a diamond single crystal grown from said one diamond single substrate is caused to cover diamond single crystals grown on the other substrates, to achieve an overall integration.

2. A method for manufacturing a diamond single crystal composite substrate which is constructed from a plurality of diamond single crystal substrates with uniform plane orientations disposed side by side and integrated overall by growing diamond single crystals thereon by vapor phase synthesis, the method comprising: providing a plurality of diamond single crystal substrates in which the deviation of the plane orientation of the main plane of each of said plurality of diamond single crystal substrates, excluding one diamond single crystal substrate, from the {100} plane is less than 1 degree and the deviation of the plane orientation of the main plane of the excluded one substrate from the {100} plane is ito 8 degrees; disposing said plurality of diamond single crystal substrates side by side in such an arrangement that said one substrate is disposed in the outermost circumferential part and the <100> direction in the main plane of said one substrate faces in the outer circumferential direction of the disposed substrates; and then growing diamond single crystals by vapor phase synthesis so that the diamond single crystal grown from said one substrate is caused to cover diamond single crystals grown on the other substrates, to achieve an overall integration.

* * * * *